United States Patent [19]
Matsuyama et al.

[11] Patent Number: 5,852,624
[45] Date of Patent: Dec. 22, 1998

[54] SEMICONDUCTOR LASER ELEMENT, METHOD OF MANUFACTURING SEMICONDUCTOR LASER ELEMENT, AND LASER DIODE MODULE

[75] Inventors: Takayuki Matsuyama, Hiratsuka; Chisato Furukawa, Atsugi, both of Japan

[73] Assignee: Kabushiki Kaisha Toshiba, Kawasaki, Japan

[21] Appl. No.: 632,116

[22] Filed: Apr. 15, 1996

[30] Foreign Application Priority Data

May 15, 1995 [JP] Japan ................................. 7-140022

[51] Int. Cl.$^6$ .............................. H01S 3/19; H01L 21/20
[52] U.S. Cl. .................................. 372/44; 372/46; 372/50; 438/33; 438/28
[58] Field of Search ................................. 372/36, 44, 50, 372/109, 46; 438/33, 28

[56] References Cited

PUBLICATIONS

Imai et al., "Compound Semiconductor Device II", 1985, pp. 201–202, (no month available).

*Primary Examiner*—Phan T. H. Palmer
*Assistant Examiner*—Quyen Leung
*Attorney, Agent, or Firm*—Finnegan, Henderson, Farabow, Garrett & Dunner, L.L.P.

[57] ABSTRACT

In the semiconductor laser element of the present invention, a striped active layer for injecting an electrical current, is formed on the main surface of the semiconductor substrate. A pair of notches for dividing the semiconductor substrate, are made in the main surface of the semiconductor substrate so as to be in parallel with each other interposing the striped active layer. Each of the pair of notches has the ratio between the depth d thereof and a double of the width w, that is 2w, (d/2w), of 1.0 or higher.

13 Claims, 6 Drawing Sheets

SEMICONDUCTOR LASER ELEMENT, METHOD OF MANUFACTURING SEMICONDUCTOR LASER ELEMENT, AND LASER DIODE MODULE

BACKGROUND OF THE INVENTION

1. Field of the Invention

The present invention relates to a semiconductor laser element which can be easily formed from a wafer a method of manufacturing such a semiconductor laser element, and a laser diode module, in which a semiconductor laser element is built in, used for communications or the like.

2. Description of the Related Art

The significant difference between a semiconductor laser element and other semiconductor elements such as transistors and ICs, is that a cleaved facet formed by processing an element end surface is used as a resonator.

For example, in a Fabry-Perot laser, an end surface of an element is used as a mirror by utilizing the difference in index of refraction between the semiconductor and the air, and a cleaved facet situated vertical to the joint surface between a p type and n type is used as a resonator.

In order to manufacture such a cleaved facet, a wafer which was subjected to crystal growth and electrode process, is processed into a bar shape, and the bar-shaped wafer is further divided into individual elements.

Figure 1:
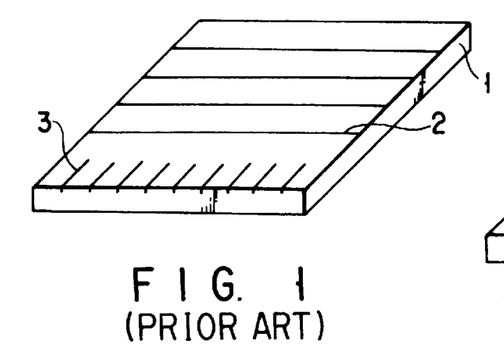
FIG. 1 is a perspective view of a wafer, illustrating one step of making semiconductor laser elements according to the conventional technique.
Figure 2:
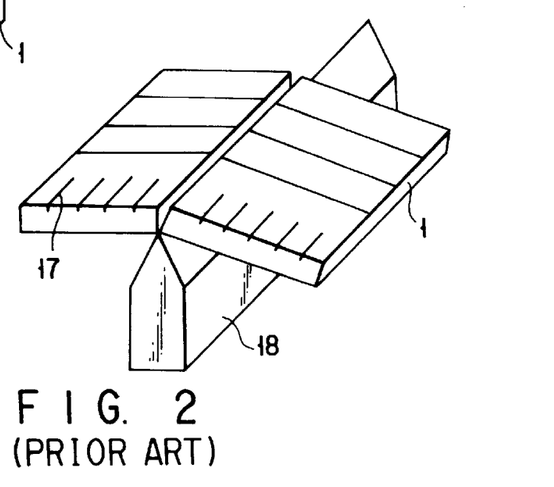
FIG. 2 is a diagram showing a step of slicing a conventional laser element wafer shown in FIG. 1, into sliced laser bars.
Figure 3:
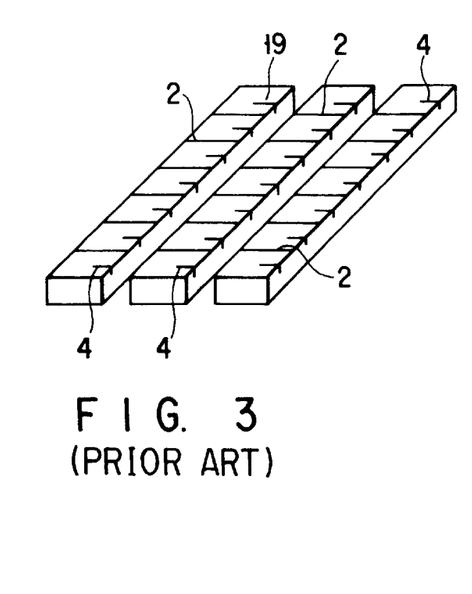
FIG. 3 is a diagram showing a step of cutting a marking-off line on a sliced semiconductor laser bar.

FIGS. 1 to 3 show steps of manufacturing semiconductor laser elements, according to a conventional technique.

As can be seen in FIG. 1, a plurality of stripe active layers 2 are formed on a wafer 1 made of InP semiconductor, and a plurality of marking lines 3 are cut on an end surface of the wafer 1 in the direction normal to that of the formation of the active layers 2 by means of a scriber.

Figure 4:
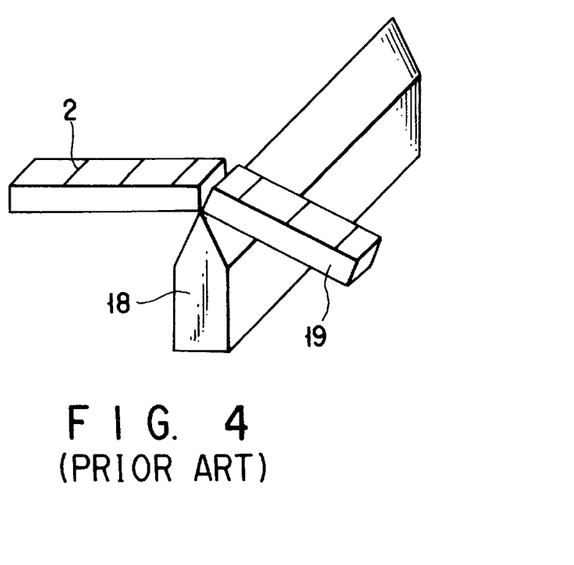
FIG. 4 is a diagram showing a step of slicing a semiconductor laser bar into individual elements.
Figure 5:
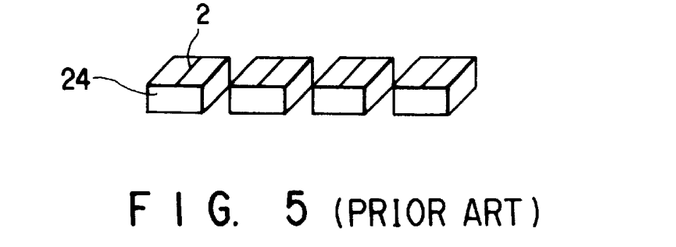
FIG. 5 is a perspective view of a plurality of completed LD chips.

Next, the apex of a wedge-shaped jig 18 is aligned with respect to the position facing a marking line 3, on another surface of the wafer 1, which is opposite to the surface on which the marking lines 3 are cut. Then, by utilizing the apex as the fulcrum, a force is applied to both ends of the wafer 1, thus dicing the wafer into bars as shown in FIG. 2. After that, marking lines 4 are cut on each active layer 2 at an interval corresponding to the width of an element of a semiconductor laser bar 19 again by the scriber as shown in FIG. 3. With use of a wedge-shaped jig 18 as in a manner in which the semiconductor laser bars are formed as shown in FIG. 4, the laser bar 19 is diced into individual elements, thus completing LD (laser diode) chips 24 each having a stripe-shaped active layer 2 as shown in FIG. 5.

For forming LD chips from a wafer 1, conventionally, there is a method in which a mechanism which moves a razor up and down while fixing a wafer or a semiconductor razor bar, is used. Such a method is disclosed in "Compound Semiconductor Device HI" by IMAI et al. by published by Kogyo Reseacher's Organization (1985), pages 201 to 202, Jap. Pat. Appln. KOKOKU Publication No. 57-5051, etc.

Further, there is a method in which a groove is made at a position from which a semiconductor laser element is separated, and the groove is utilized as a guide for making a cut by a scriber.

Figure 6:
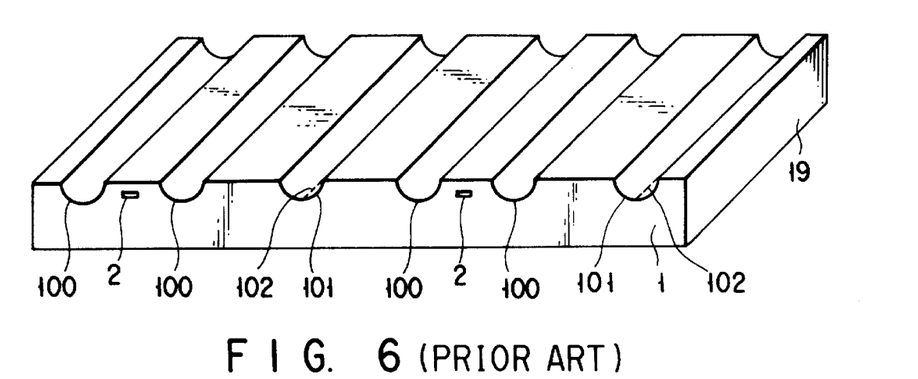
FIG. 6 is a perspective view of an example of the structure of a conventional semiconductor laser bar.

FIG. 6 shows a semiconductor laser bar 19 cut from the wafer 1, and the bar 19 has buried layer separation grooves 100 and element separation grooves 101.

Each buried layer separation grooves (groove portion) 100 is located on each side of the stripe-like active layer 2, in order to reduce the capacity of the element. Each element separation groove (guide groove) 101 serves as a guide for marking a cut on an LD chip.

Along each element separation groove 101, a cut 102 is made by the scriber, and after that, the bar is separated into individual semiconductor laser elements by means of the wedge-shaped jig 18 shown in FIG. 2. However, the above conventional technique entails the following drawbacks.

(1) When a wafer is processed into bars and each bar is separated into individual semiconductor laser elements, it is necessary to make cuts by a scriber or razor in the number corresponding to the number of the elements, taking a great amount of time.

(2) Since the cuts are made by a scriber, razor or the like, the appearance of each element is not very good. Further, cut-off waste of a wafer generated when cuts are made, is adhered to a contact surface of an element, resulting in increasing a leak current. This causes a decrease in yield of the production of elements.

(3) In the case of a mesa-type semiconductor laser element as shown in FIG. 6, forces are applied to the wafer 1 while separating it into individual elements after processed into bars. During the application of the forces, the wafer is, in some cases, cracked from a groove portion 100 designed for separating the buried layer, causing reduction in the number of elements which can be obtained from one wafer.

Further, in the state in which each and individual semiconductor laser element is completed, the groove portion 100 serves as a thin portion of the wafer 19, and therefore elements themselves may be easily damaged.

(4) In the case where a plurality of mesa-type semiconductor laser elements are used in an array, each guide groove 101 is made between adjacent elements. However, these guide grooves 101 serve as thin portions of the wafer 19, and the array may be easily damaged.

(5) In the case of a laser diode (LD) module for communications, in which such a semiconductor laser element is built, since the wafer is not, in some cases, sliced into semiconductor laser elements accurately along with the guide grooves 101, it is conventionally difficult to accurately align a laser beam with respect to an optical fiber.

SUMMARY OF THE INVENTION

The present invention has been achieved in consideration of the above-described circumstances, and the object thereof is to provide a semiconductor laser element and a laser diode module having a high mechanical strength, and a method of manufacturing such an element, capable of accurately dicing a wafer for making semiconductor laser elements, and having a high yield of steps.

In order to achieve the above-described object, a semiconductor laser element of the present invention includes:

a semiconductor substrate;

a striped active layer, formed on a surface region of a main surface of the semiconductor substrate; and element separation grooves made in the activation layer of the main surface of the semiconductor substrate so as to be adjacent to each other at an interval, for separating the semiconductor substrate into individual elements, the element separation grooves having a ratio (d/2w) of a depth from the main surface of the semiconductor substrate with respect to a double of width 2w of 1.0 or higher.

Another semiconductor laser element of the present invention includes:

a semiconductor substrate;

a striped active layer, formed on a surface region of a main surface of the semiconductor substrate; and a pair of U-shaped notches made in the main surface of the semiconductor substrate so as to be in parallel to each other, on both sides of the striped active layer, each of the pair of notches having a ratio (d/2w) of a depth d with respect to a double of width 2w of 1.0 or higher, and a pair of buried layer separation grooves made in the main surface of the semiconductor substrate, on both sides of the stripe active layer, at a predetermined interval, each of the pair of the buried layer separation grooves, having such a relationship that a ratio (DBH/WBH) of a depth DBH from the main surface of the semiconductor substrate with respect to a width WBH, is lower than a ratio (d/2w) of a depth d of the notch from the main surface of the semiconductor substrate with respect to a double of the width 2w, (DBH/WBH<d/2W).

A semiconductor laser element array of the present invention includes:

a semiconductor substrate;

a plurality of striped active layers, formed on a surface region of a main surface of the semiconductor substrate, for injecting a plurality of currents; and a plurality of pairs of buried layer separation grooves made in the main surface of the semiconductor substrate and on both sides of each of the stripe active layers, at a predetermined interval;

a pair of U-shaped notches for dividing the semiconductor substrate so as to be in parallel to each other, interposing all of the plurality of pairs of the buried layer separation grooves, each of the pair of notches having a ratio (d/2w), of a depth d taken from the main surface of the semiconductor substrate with respect to a double of the width 2w of 1.0 or higher, and each of the pairs of the buried layer separation grooves having such a relationship that a ratio (DBH/WBH) of a depth DBH from the main surface of the semiconductor substrate with respect to a width WBH, is lower than a ratio (d/2w) of a depth d of the notch from the main surface of the semiconductor substrate with respect to a double of the width 2w, (DBH/WBH<d/2W).

Further, the method of manufacturing a semiconductor laser element, according to the present invention, includes the steps of:

forming a plurality of striped active layers made of semiconductors containing one of InGaAs and InGaAsP, for injecting an electrical current to a surface region of a main surface of a semiconductor substrate made of InP substrate;

forming a pair of U-shaped notches which are located on both sides of the active layer, by selectively wet-etching the main surface of the semiconductor substrate with a sulfuric acid-based etchant, each of the pair of the notches having a ratio (d/2w) of a depth d from the main surface of the semiconductor substrate with respect to a double of the width 2w of 1.0 or higher, and forming a pair of buried layer separation grooves made in the main surface of the semiconductor substrate, on both sides of the stripe active layer, at a predetermined interval, each of the pair of the buried layer separation grooves, having such a relationship that a ratio (DBH/WBH) of a depth DBH from the main surface of the semiconductor substrate with respect to a width WBH, is lower than a ratio (d/2w) of a depth d of the notch from the main surface of the semiconductor substrate with respect to a double of the width 2w, (DBH/WBH<d/2W); and slicing the semiconductor substrate from a rear surface which opposes to the main surface thereof, to form a resonance surface, and further slicing the semiconductor substrate from the main surface, using the notches as guides, thus making a plurality of semiconductor laser elements, each having a resonance surface, a striped active layer, and a pair of buried layer separation grooves formed on both sides of the striped active layer, from the semiconductor substrate.

Further, a laser diode module of the present invention comprises:

a semiconductor laser element consisting of a semiconductor substrate; a striped active layer for injecting a current, formed on a surface region of a main surface of the semiconductor substrate; and a pair of U-shaped notches made in the main surface of the semiconductor substrate so as to be in parallel with each other, on both sides of the active layer, for separating the semiconductor substrate into individual elements, each of said pair of notches having a ratio (d/2w) of a depth from the main surface of the semiconductor substrate with respect to a double of the width 2w, of 1.0 or higher;

supporting means for supporting the semiconductor laser element;

lead means to which a drive signal is input so as to cause an emission of the semiconductor laser element;

lens means on which a laser beam is made incident, the laser beam being generated as activated by the semiconductor laser element; and optical fiber means for receiving the laser beam emitted from the lens and outputting it as an optical signal.

With the above-described structure, the semiconductor laser element, the method of manufacturing such a semiconductor laser element, and the laser diode module, according to the present invention, entails the following advantages. That is, (1) a chip is sliced using a guide groove made by the process, and therefore the scribe step, which is conventionally necessary for slicing a chip, can be omitted, thus significantly decreasing the number of steps; (2) a scriber or a razor is not brought into direct contact with an individual chip, and therefore the appearance of the chip can be maintained clear, thus making it possible to significantly reduce errors due to an undesired appearance; (3) a cut is not made by a scriber or a razor in the chip slicing step, and therefore the reliability of the element, which may be lowered due to an increase in leak current, caused by a cut waste of the wafer adhered to the contact surface of the element, can be maintained; (4) the groove aspect ratio and the groove shape are controlled so that a large stress is concentrated on the element separation groove (guide groove) rather than on the buried layer separation groove (groove portion), and therefore the element is not cracked from the buried layer separation groove, thus increasing the number of elements which can be produced from one wafer and improving the mechanical strength of a product such as a semiconductor laser element array; (5) An element separation groove and a buried layer dividing groove are made at the same time by the process, and therefore it is not necessary to provide a new process for adding the function of the present invention, but the present invention can be practiced with the same steps as those of the conventional technique. Further, since the surface orientation dependency of a substrate is utilized, a suitable shape of the element can be obtained by self-alignment; and (6) a semiconductor laser element can be sliced accurately along the notches, and therefore a laser beam emitted can be accurately aligned with the optical fiber of the LD module.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Embodiments of the present invention will now be described with reference to accompanying drawings.

The method of manufacturing a semiconductor laser element, according to the present invention, will now be explained for individual steps with reference to FIGS. 7 to 20, and a semiconductor laser element obtained by the manufacturing method will be also discussed.

(1) Process step

Figure 7:
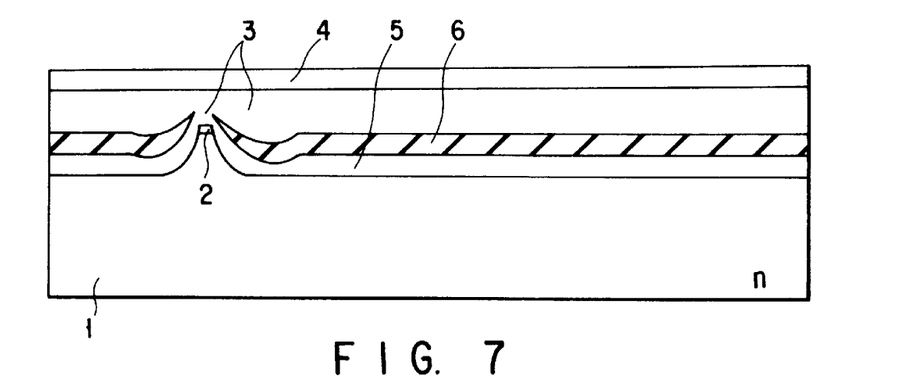
FIG. 7 is a cross section of a wafer-shaped semiconductor substrate in the state in which a portion which gives rise to a semiconductor laser element is formed, which is a step of obtaining an LD chip, another embodiment of the present invention.

FIG. 7 is a cross section of a wafer-shaped semiconductor substrate 1 in the state that a portion which gives rise to a semiconductor laser element is formed. The semiconductor substrate 1 uses an n-InP substrate 1 having a crystal plane of (100) as a main surface.

On the n-InP substrate 1, a striped InGaAsP active layer 2 is formed, and further, a p-InP buried layer 5 and an n-InP buried layer 6 are formed in this order on the sections other than that of the InGaAsP active layer 2.

On the surfaces of the InGaAsP active layer 2 and the n-InP buried layer 6, an n-InP clad layer 3 and an InGaAs contact layer 4 are laminated in the order. Further, as can be seen in FIG. 8, a $SiO_2$ film 7 is deposited on the entire surface thereof by a CVD method, a window 8 (width of 20 $\mu$m) used for forming a buried layer separation groove and a window 9 (width of 8 $\mu$m) used for forming an element separation groove, are made by selectively etching the film by a photo-lithography technique.

Figure 8:
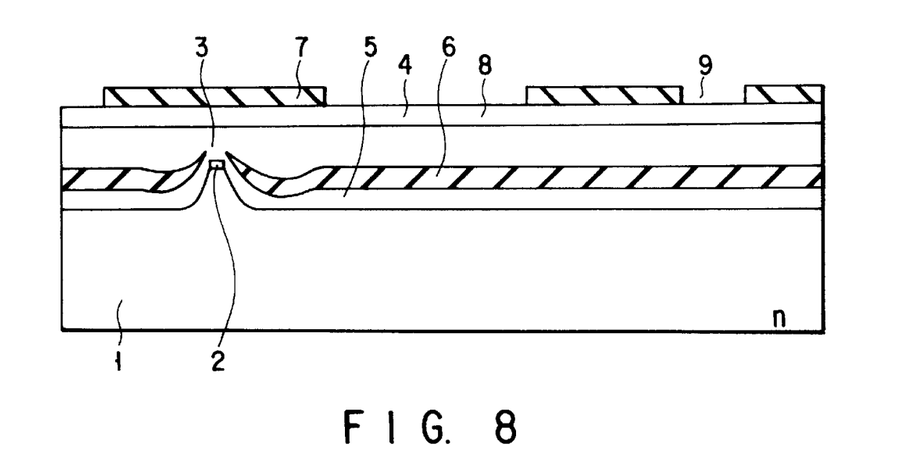
FIG. 8 is a cross section of the wafer-shaped semiconductor substrate, illustrating another step which follows the one shown in FIG. 7.

A cleaved facet exposing from the InGaAsP active layer 2 shown in FIG. 8 constitutes a resonance surface of a semiconductor laser element.

The striped active layer 2 is formed in a crystal orientation of <01$\bar{1}$1> of the element.

Figure 9:
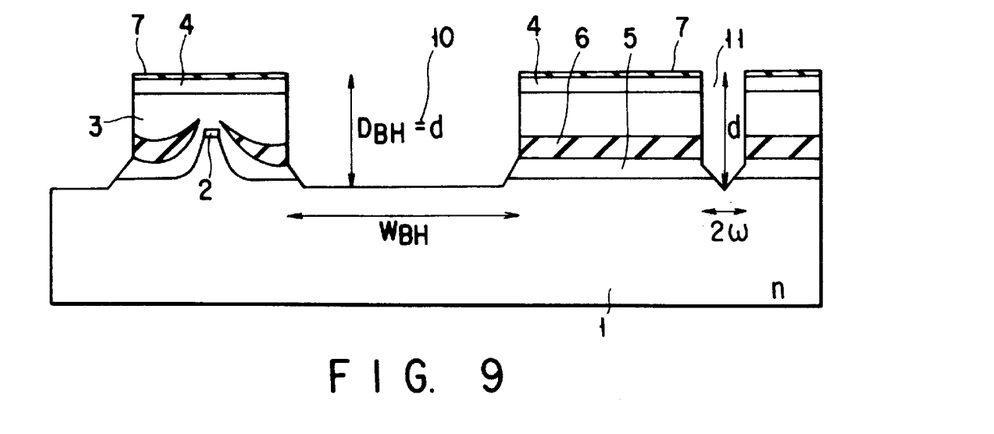
FIG. 9 is a cross section of the wafer-shaped semiconductor substrate, illustrating another step which follows the one shown in FIG. 8.

Next, as shown in FIG. 9, the p-InGaAs contact layer 4 is etched with an acid-based etching liquid, using the $SiO_2$ film 7 as a mask. Then, using the p-InGaAs contact layer 4 as a mask, the n-InP clad layer 3, the n-InP buried layer 6, the p-InP buried layer 5 and a part of the n-InP substrate are formed at the same time by etching with an acid-based etching liquid, thus obtaining a buried layer separation groove 10 and an element separation groove 11. The buried layer separation groove 10 is provided so as to reduce the element capacity of each of the n-InP buried layer 6 and the p-InP buried separation layer 5.

During the formation of these grooves, the etching time is controlled so that the depth DBH of the buried layer separation groove 10 and the width d of the element separation groove 11 are both 10 $\mu$m.

The ratio between the depth DBH and the width WBH of the buried separation groove 10, (DBH/WBH) is set smaller than the ratio between the depth d and the width 2w of the element separation groove 11, (d/2w). (w is the width of the U-shaped notch after the separation of elements, since the width of the groove of the wafer semiconductor substrate is 2w.)

The buried layer separation groove 10 and the element separation groove 11 are formed on the same semiconductor substrate 1 by the same etching method, and therefore they have usually the same depth from the main surface of the semiconductor substrate, that is expressed as DBH=d.

In the above-described example, the buried layer separation groove 10 has a ratio of DBH/WBH=0.5, and the element separation groove has a ratio of d/2w=1.25.

In particular, the case where a condition of 5×(DBH/WBH)≦d/2w>DBH/WBH is satisfied, is preferable in terms of production step as well as the mechanical strength of the wafer.

Further, due to the plane orientation dependency of the acid-based etchant, the crystal orientation of the bottom surface of the groove of the element separation groove 11 will have a (111) plane or (1$\overline{1}$1) plane, and the element separation groove 11 will have a sagittate shape.

(That is, this etching proceeds within the InP substrate while exposing these planes at all times.)

Figure 10:
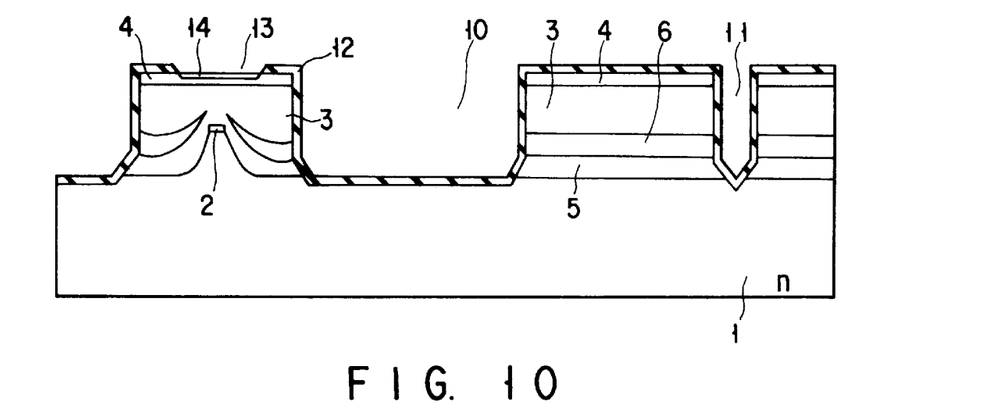
FIG. 10 is a cross section of the wafer-shaped semiconductor substrate, illustrating another step which follows the one shown in FIG. 9.

Next, as shown in FIG. 10, the remaining portion of the SiO$_2$ film 7 is removed and another SiO$_2$ film 12 is once again formed on the entire surface of the SiO$_2$ film 12, and then a window 13 used for injecting an electrical current is made in the section of the SiO$_2$ film 12, located above the active layer 12, by a photolithography technique. An AuZu electrode 14 is deposited in the window 13 by a lift-off method, so as to make it into an alloy.

Figure 11:
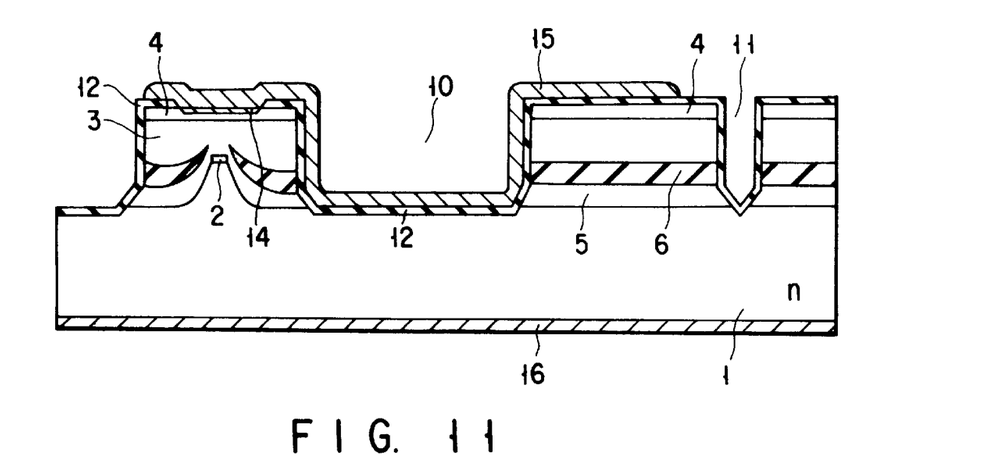
FIG. 11 is a cross section of the wafer-shaped semiconductor substrate, illustrating another step which follows the one shown in FIG. 10.

After that, as can be seen in FIG. 11, an overcoat electrode Ti/Pt/Au 15 is formed on the AuZu electrode 14, on the p-InGaAs contact layer 4, and on the SiO$_2$ film 12 formed along the buried layer separation groove 10 by means of the photolithography technique and the lift-off method.

The rear surface of the semiconductor substrate 1 is polished, and then an AuGe/Ni/Au electrode 16 is formed as an n-side electrode by a vacuum deposition method.

Thus, the buried layer separation groove 10 is made in the main surface of the wafer-like semiconductor substrate 1 so as to be adjacent to the active layer 2 at an interval.

FIG. 11 illustrates the case where the buried layer separation groove 10 and the element separation groove 11 are formed at an interval in one side of the active layer 2. However, in the case where a plurality of active layers 2 are formed along with each other, buried layer separation grooves 10 are formed on both sides of a unit active layer 2 on the semiconductor substrate 1, and an element separation groove 11 common to active layers 2 adjacent to each other is provided between the buried layer separation groove 10 for one of the active layers 2 and the buried layer separation groove 10 for the other active layer 2. The element separation groove 11 is repeatedly formed in accordance with the number of the active layers 2.

(2) Bar slicing step

Figures 12, 13, 14:
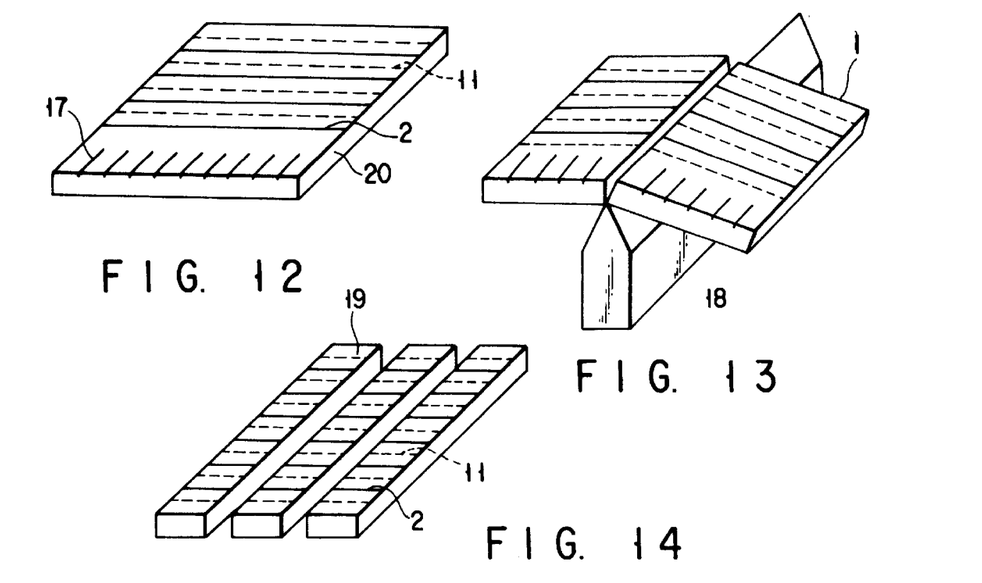
FIG. 12 is a perspective view of a wafer, illustrating one step of making semiconductor laser elements from the wafer-shaped substrate shown in FIG. 11.
FIG. 13 is a diagram showing a step of slicing the wafer-shaped semiconductor substrate shown in FIG. 12, into sliced laser bars.
FIG. 14 is a diagram showing a step of cutting a marking-off line on a sliced semiconductor laser bar.

As can be seen in FIG. 12, scribe cuts 17 each having a length of 600 μm are made so as to be in parallel with each other at an interval of 300 μm by means of a scriber, on one end portion of a wafer 20 obtained in the process step.

The scribe cuts 17 are formed in the direction normal to the longitudinal direction of the active layer 2 and the element separation groove 11.

Then, as shown in FIG. 13, the edge of the wedge-shaped jig 18 is aligned at a position corresponding to a scribe cut 17, which is located on the opposite surface of the wafer 20 to that on which the scribe cuts 17 are made, and a force is applied on both ends of the wafer 20 while setting the edge as a fulcrum. In this manner, the wafer 20 is sliced into bars as shown in FIG. 14, thus obtaining semiconductor laser bars 19.

(3) Chip slicing step

Figure 15:
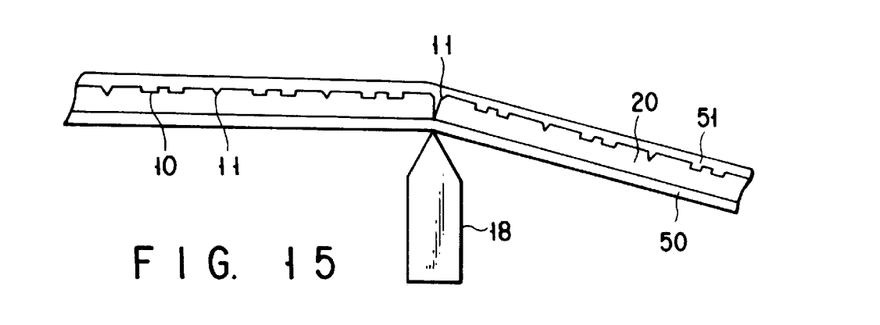
FIG. 15 is a diagram showing a step of slicing a semiconductor laser bar into chips.

As shown in FIG. 15, a semiconductor laser bar 19 obtained in the above-described bar slicing step is sandwiched between a thermally expandable/contractible sheet 50 having an adhesion property and a transparent film 51, and the wedge-shaped jig 18 is in advance placed on the rear surface of the semiconductor laser bar 19 along the element separation groove 11 formed in the process step. Then, the wafer 20 is divided along the element separation groove 11, thus obtaining individual semiconductor laser elements.

The above-described operation entails the following aspects, that is, the degree of concentration of stress on the element separation groove 11 is large since the aspect ratio of the element separation groove is larger than that of the buried layer separation groove, and the shape of the element separation groove 11 is has a sagittate shape, and therefore the degree of concentration of the stress on the bottom portion of the groove is higher than the case of the buried layer separation groove 10 having a U shape. Due to the just-mentioned two facts, the wafer 20 is divided selectively on the element separation groove 11, into chips, and the wafer 20 is not divided along the buried layer separation groove 10 as in the conventional technique. Thus, the wafer 20 is surely divided along the element separation groove 11, and therefore one wafer is not wastefully divided into a plurality of semiconductor laser elements. Consequently, the number of elements which can be obtained from one wafer can be increased as compared to the conventional cases.

(4) Chip separation step

Figure 16:
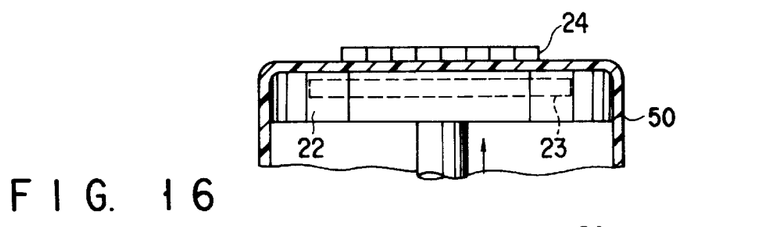
FIG. 16 is a diagram showing a step of separating the chips obtained by slicing the semiconductor laser bar, from each other.

Next, the transparent film 51 is peeled from the semiconductor laser bar 19, and the laser bar 19 now fixated on the adhesive sheet 50 is fixed on a lifter 22 having a heating mechanism, as shown in FIG. 16.

Figure 17:
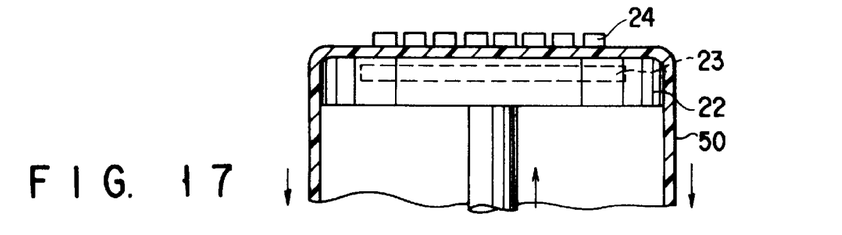
FIG. 17 is a diagram showing the state in which the semiconductor laser bar is divided into chips.

Next, while applying heat to the lifter 22 by means of the built-in heater 23, the lifter 22 is lifted as can be seen in FIG. 17. In this operation, the adhesive sheet 50 is expanded in the direction indicated by the arrow in the figure. Accordingly, the semiconductor laser element 24 is divided into individual pieces. Then, thus divided semiconductor laser elements 24 are stored in a chip tray by means of an automatic picking and placing device, which is not shown in the figure.

Figure 18:
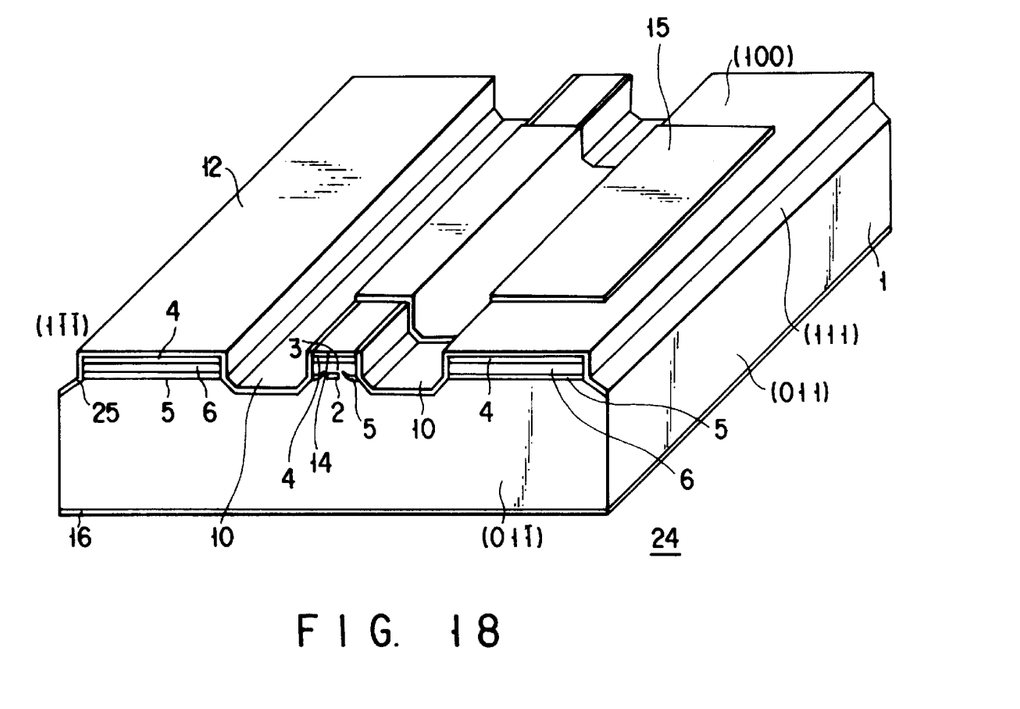
FIG. 18 is a perspective diagram showing an embodiment of a semiconductor laser element of the present invention.

FIG. 18 is a perspective view of a semiconductor laser element 24 formed in the above-described manner.

The semiconductor laser element 24 is divided into individual pieces along each element separation groove 11, and therefore an element separation groove 11 will make notch portions 25, when the element is divided along with the groove. More specifically, a semiconductor laser element 24 in which notch portions 25 are formed so as to be symmetrical with respect to the striped active layer 2, is obtained. The crystal plane orientations of the bottom surfaces of the notch portions 25 are as follows. That is, the bottom surface on the left side with respect to the (011) plane of the end surface of the semiconductor laser element 24 has a (11$\overline{1}$) plane, whereas that of the right side has a (1$\overline{1}$1) plane.

The semiconductor laser element 24 is formed on the n-InP substrate 1. The striped InGaAsP active layer 2 is buried in a surface region of the main surface of the n-InP substrate 1. The p-InP clad layer 3 is formed on the active layer 2, and an alloy AnZn electrode 14 is formed thereon via an InGaAs contact layer 4.

The InP buried layer 5 and the n-InP buried layer 6 which are laminated are formed on the semiconductor substrate 1 on both sides of the active layer 2.

These laminated layers 5 and 6 are used as a current block layer for blocking a current flowing these layers.

The exposed surface of the active layer 2 is utilized as a cleaved facet or a cavity. The striped active layer 2 is formed in the <011> orientation. The buried layer separation groove (groove portion) 10 is made in the laminated buried layers 5 and 6 in order to reduce the element capacity. The contact layer 4, the inner surface of the buried layer separation groove 10, the AuZn electrode 14 and the notch portions 25 are covered by the SiO$_2$ insulation film 12. The ratio DBH/WBH between the depth DBH and the width WBH of the buried layer separation groove 10 is set smaller than the ratio d/2w between the depth d and a double of the width 2w of a notch portion 25.

The overcoat electrode (Ti/Pt/Au) 15 is formed on the AuZn electrode 14 so as to be electrically connected thereto.

The overcoat electrode 15 is used for wire-bonding. This overcoat electrode 15 is extended in one of the grooves of an adjacent buried layer separation groove 10, and further extended along the $SiO_2$ insulation film 12 situated on the contact layer 4, to a vicinity of the notch portion 25.

The AuGe/Ni/Au electrode 16 is formed on the rear surface of the semiconductor substrate 1 as an n-side electrode.

(5) Mounting and Wire-bonding step

Figure 19:
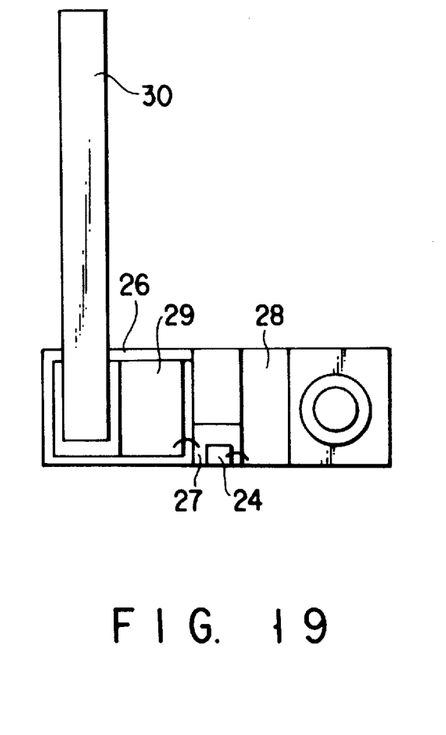
FIG. 19 is a plan view showing an embodiment of the semiconductor laser device, in which a semiconductor laser element of the present invention is mounted on a chip carrier.
Figure 20:
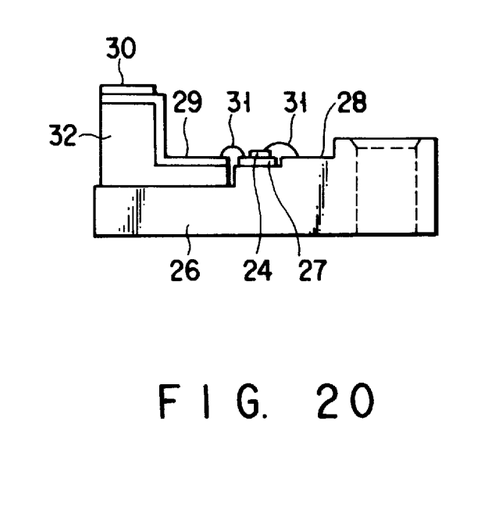
FIG. 20 is a side view of the semiconductor laser device shown in FIG. 19.

The semiconductor laser element 24 manufactured as above, is mounted on a chip carrier 26 having steps as shown in FIGS. 19 and 20, and thus a semiconductor laser device is completed.

A heat sink 27 is mounted on the chip carrier 26, and the semiconductor laser element 24 is die-bonded on the heat sink 27 by means of AuSn solder.

Next, the overcoat electrode on the semiconductor laser element 24 and an anode 28 of the chip carrier 26 are connected to each other by means of a bonding wire 31, and so are the heat sink 27 electrically connected to the n-side electrode of the semiconductor laser element 24 and a cathode 29 of the chip carrier, thus completing a semiconductor laser device.

The cathode 29 is formed on the ceramic base 32, which is mounted on the chip carrier 26. A cathode lead 30 is connected onto the cathode 29.

Figure 21:
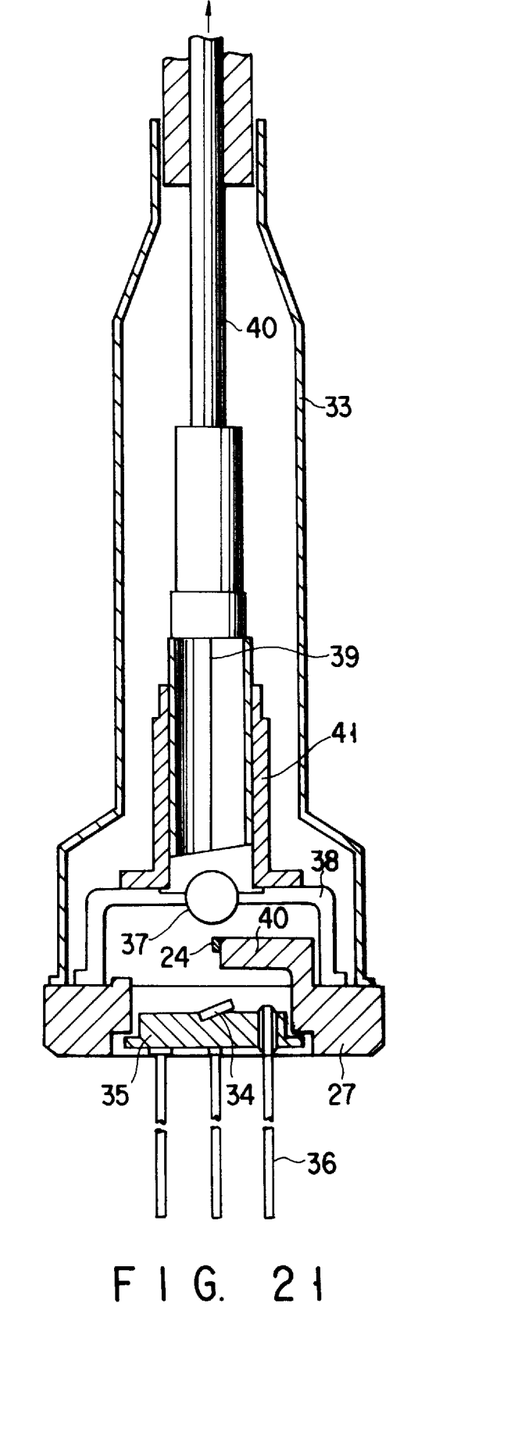
FIG. 21 is a cross section of an embodiment of a laser diode module, in which a semiconductor laser element of the present invention is mounted.

Next, with reference to the partial cross sectional view shown in FIG. 21, an LD (laser diode) module in which the semiconductor laser element 24 is mounted will now be described.

The laser element 24 is fixed to the distal end of a supporter 40 which stand upon the upper surface of the ring-like heat sink 27 made of, for example, Cu.

A lens holder 38 for holding a lens (sapphire) 37 is mounted on the heat sink 27 so as to be located on the upper portion of the semiconductor laser element 24 fixed to the supporter 40.

A supporter 41 for supporting an optical fiber 39 is mounted on the lens holder 38 so that one end of the optical fiber 39 is situated to face the lens 37. The optical fiber 39 is coated with a protection film, thus a fiber cord 40 is made.

A cord holder (PVC) 33 is mounted on the heat sink 27 so as to surround the semiconductor laser element 24, the lens 37 and the fiber cord 40.

A header 35 on which a photodiode 34 is mounted, is fixated inside the heat sink 27. A lead 36 for inputting an electrical signal to the photodiode 34 is mounted on the header 35.

The lead 36 is electrically connected to an electrode (not shown) of the photodiode 34.

When an electrical signal is input to the semiconductor laser element via the lead 36, light is emitted from the semiconductor laser element 24. The emitted light is input to one end of the optical fiber 39 via the lens 37, and then output as an optical signal from the distal end of the fiber cord 40 including the optical fiber 39.

In the above-described manner, an LD (laser diode) module in which the semiconductor laser element 24 of the present invention is mounted, is obtained.

In the case where the semiconductor laser element 24 is built in a communication LD module which emits laser beams, a laser beam emitted from the laser element 24 can be aligned accurately with the optical fiber 39 of the LD module, since the laser element 24 of the present invention is formed by slicing a wafer accurately along the element separation groove 11. Therefore, the performance of the LD module can be improved.

Next, the second embodiment of the present invention, having a structure of a semiconductor element array including a plurality of active layers, will now be described with reference to the perspective view shown in FIG. 22.

Figure 22:
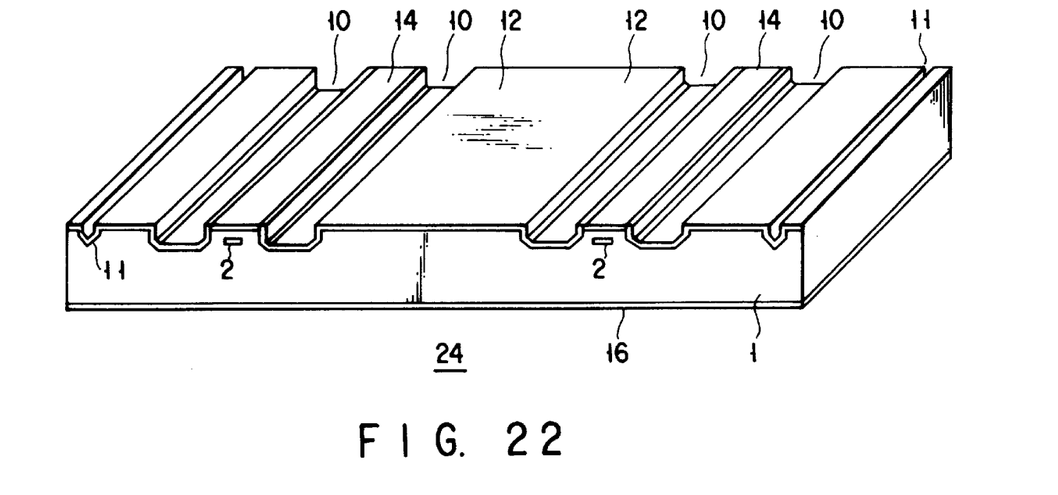
FIG. 22 is a perspective view of a semiconductor laser element comprising of a semiconductor element array including a plurality of active layers, according to the second embodiment of the present invention.

FIG. 22 illustrates a unit semiconductor laser array in which two InGaAsP active layers 2 are provided between two element separation grooves 11 provided in a wafer-like semiconductor substrate 1.

A pair of buried layer separation grooves 10 are located on both sides of each of the active layers 2.

Each of the element separation grooves 11 located on each end of the array is sliced from its center portion, and both ends of the unit element array are used in the notch shape. However, in order to simplify the explanation, FIG. 22 illustrates the state in which the groove portion is maintained unsliced. With regard to the semiconductor element array of the present invention, the number of active layers 2 can be determined in accordance with necessity for each individual case. In this embodiment, two active layers 2 are used. An AuZu electrode 14 serving as a P-side electrode is provided above each one of InGaAsP active layers 2, and thus formed electrodes 14 are independent from each other for each element. An AuGe/Ni/Au layer 16 is provided on the lower bottom of the semiconductor substrate 1 as an N-side electrode, so as to be common to the elements.

The semiconductor laser element array of the above-described embodiment is used as, for example, a semiconductor laser element array for optical parallel link of the optical inter-connecting technique necessary for connecting computers or boards at a high speed.

With the above-described structure, a wafer can be divided into elements accurately along the element separation grooves, and therefore a semiconductor laser array element having a predetermined width can be formed.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor laser element comprising:
   a semiconductor substrate;
   a striped active layer on a surface region of a main surface of the semiconductor substrate; and
   a plurality of element separation grooves in the striped active layer on the surface region of the main surface of the semiconductor substrate so as to be adjacent to each other at an interval, for separating the semiconductor substrate into individual elements, the element separation grooves having a ratio of (d/2w) of a depth d from the main surface of the semiconductor substrate with respect to twice width w of higher than 1.0, each element separation groove forming a pair of notches when divided.

2. A semiconductor laser element according to claim 1, wherein an angle made between a bottom surface and a side surface of said notch, is 90° or larger.

3. A semiconductor laser element according to claim 1, wherein a crystal plane which constitutes the main surface of said semiconductor substrate is a (100) plane, a crystal plane which constitutes side surfaces of said semiconductor substrate are a (01$\bar{1}$) plane and a (0$\bar{1}$1) plane, and a crystal plane which constitutes the bottom surface of said notch is a (11$\bar{1}$) plane.

4. A semiconductor laser element according to claim 1, wherein said semiconductor substrate is made of an InP semiconductor and said striped active layer is made of either one of InGaAs and InGaAsP conductors.

5. A semiconductor laser element comprising:
   a semiconductor substrate;
   a striped active layer, formed on a surface region of a main surface of the semiconductor substrate; and
   a pair of U-shaped notches made in the main surface of the semiconductor substrate so as to be in parallel to each other, on both sides of the striped active layer, each of the pair of notches having a ratio (d/2w) of a depth d with respect to a double of width 2w of 1.0 or higher, and a pair of buried layer separation grooves made in the main surface of the semiconductor substrate, on both sides of the stripe active layer, at a predetermined interval, each of the pair of the buried layer separation grooves, having such a relationship that a ratio (DBH/WBH) of a depth DBH from the main surface of the semiconductor substrate with respect to a width WBH, is lower than a ratio (d/2w) of a depth d of the notch from the main surface of the semiconductor substrate with respect to a double of the width 2w, (DBH/WBH<d/2W).

6. A semiconductor laser element according to claim 5, wherein the ratio of the depth d of said notch taken from the main surface of said semiconductor substrate with respect to the double width 2w, (d/2w), is higher than the ratio of the depth DBH of said buried layer separation groove taken from the main surface of said semiconductor substrate with respect to the width WBH thereof, (DBH/WBH), but equal to or less than five times as high as this ratio (DBH/WBH<d/2W≦5 (DBH/WBH)).

7. A semiconductor laser element according to claim 5, wherein an angle made between a bottom surface and a side surface of said notch, is 90° or larger.

8. A semiconductor laser element according to claim 5, wherein a crystal plane which constitutes the main surface of said semiconductor substrate is a (100) plane, a crystal plane which constitutes side surfaces of said semiconductor substrate are a (01$\bar{1}$) plane and a (0$\bar{1}$1) plane, and a crystal plane which constitutes the bottom surface of said notch is a (11$\bar{1}$) plane.

9. A semiconductor laser element according to claim 5, wherein said semiconductor substrate is made of an InP semiconductor and said striped active layer is made of either one of InGaAs and InGaAsP conductors.

10. A semiconductor laser element according to claim 5, wherein the depth of said buried layer separation groove is equal to the depth of said notch.

11. A semiconductor laser element array comprising:
    a semiconductor substrate;
    a plurality of striped active layers, formed on a surface region of a main surface of the semiconductor substrate, for injecting a plurality of currents; and
    a plurality of pairs of buried layer separation grooves made in the main surface of the semiconductor substrate and on both sides of each of the stripe active layers, at a predetermined interval;
    a pair of U-shaped notches for dividing the semiconductor substrate so as to be in parallel to each other, interposing all of the plurality of pairs of the buried layer separation grooves, each of the pair of notches having a ratio (d/2w), of a depth d taken from the main surface of the semiconductor substrate with respect to a double of the width 2w of 1.0 or higher, and each of the pairs of the buried layer separation grooves having such a relationship that a ratio (DBH/WBH) of a depth DBH from the main surface of the semiconductor substrate with respect to a width WBH, is lower than a ratio (d/2w) of a depth d of the notch from the main surface of the semiconductor substrate with respect to a double of the width 2w, (DBH/WBH<d/2W).

12. A method of manufacturing a semiconductor laser element comprising the steps of:
    forming a plurality of striped active layers made of semiconductors containing one of InGaAs and InGaAsP, for injecting an electrical current to a surface region of a main surface of a semiconductor substrate made of InP substrate;
    forming a pair of U-shaped notches which are located on both sides of the active layer, by selectively wet-etching the main surface of the semiconductor substrate with a sulfuric acid-based etchant, each of the pair of the notches having a ratio (d/2w) of a depth d from the main surface of the semiconductor substrate with respect to a double of the width 2w of 1.0 or higher, and forming a pair of buried layer separation grooves made in the main surface of the semiconductor substrate, on both sides of the stripe active layer, at a predetermined interval, each of the pair of the buried layer separation grooves, having such a relationship that a ratio (DBH/WBH) of a depth DBH from the main surface of the semiconductor substrate with respect to a width WBH, is lower than a ratio (d/2w) of a depth d of the notch from the main surface of the semiconductor substrate with respect to a double of the width 2w, (DBH/WBH<d/2W); and
    slicing the semiconductor substrate from a rear surface which opposes to the main surface thereof, to form a resonance surface, and further slicing the semiconductor substrate from the main surface, using the notches as guides, thus making a plurality of semiconductor laser elements, each having a resonance surface, a striped active layer, and a pair of buried layer separation grooves formed on both sides of the striped active layer, from the semiconductor substrate.

13. A laser diode module comprising:
    a semiconductor laser element having:
    a semiconductor substrate;
    a striped activation layer for injecting a current, on a surface region of a main surface of the semiconductor substrate; and
    a pair of U-shaped notches in the main surface of the semiconductor substrate so as to be in parallel with each other on both sides of the active layer, for separating the semiconductor substrate into individual elements, each of said pair of notches having a ratio (d/2w) of a depth d from the main surface of the semiconductor substrate with respect to twice width w of higher than 1.0;

supporting means for supporting the semiconductor laser element;

lead means to which a drive signal is input so as to cause an emission of the semiconductor laser element, a laser beam being generated as the emission of the semiconductor laser element; and optical fiber means for receiving the laser beam focused by a lens and outputting it as an optical signal.

* * * * *